United States Patent [19]

Blodgett

[11] Patent Number: 4,482,048
[45] Date of Patent: Nov. 13, 1984

[54] CONTAINER FOR STATIC-SENSITIVE ARTICLES

[75] Inventor: Norman S. Blodgett, Westboro, Mass.

[73] Assignee: James M. Brown, Cohasset, Mass.

[21] Appl. No.: 543,301

[22] Filed: Oct. 19, 1983

[51] Int. Cl.³ ............................................. B65D 73/02
[52] U.S. Cl. .................................. 206/328; 428/924; 361/212; 220/417; 220/453
[58] Field of Search ............... 206/328; 428/922, 215, 428/924; 361/220, 212; 220/417, 416, 419, 438, 440, 441, 442, 470, 453

[56] References Cited

U.S. PATENT DOCUMENTS

| 1,249,197 | 12/1917 | Rhodes . | |
| 1,268,347 | 6/1918 | Harr . | |
| 1,313,948 | 8/1919 | Maegly . | |
| 1,504,292 | 8/1924 | Wickes . | |
| 1,597,450 | 8/1926 | Lewton | 426/62 |
| 1,887,864 | 11/1932 | Stokes . | |
| 2,274,712 | 2/1942 | Kroner | 206/57 |
| 2,335,865 | 12/1943 | Lanigan | 93/3 |
| 2,534,201 | 12/1950 | Hutter | 229/315 |
| 2,543,201 | 2/1951 | Rifley | 126/110 |
| 2,570,340 | 10/1951 | George | 206/65 |
| 2,669,380 | 2/1954 | Grenier | 229/7 |
| 2,979,250 | 4/1961 | Hobbs | 229/32 |
| 3,058,586 | 10/1962 | Touart | 206/65 |
| 3,190,442 | 6/1965 | Gauss | 206/46 |
| 3,392,311 | 7/1968 | Goetmann | 317/2 |
| 3,516,596 | 6/1970 | Madden | 229/42 |
| 3,572,499 | 3/1971 | Mondane | 206/1 |
| 3,671,806 | 6/1972 | Whitmore | 317/2 R |
| 3,709,325 | 1/1973 | Gordon | 206/65 |
| 3,750,871 | 8/1973 | Cook | 206/46 |
| 3,774,757 | 11/1973 | Harris | 206/62 P |
| 3,958,022 | 5/1976 | Danesh | 426/271 |
| 3,993,827 | 11/1976 | Dukert | 428/251 |
| 4,037,267 | 7/1977 | Kisor | 361/220 |
| 4,038,693 | 7/1977 | Huffine | 360/99 |
| 4,084,210 | 4/1978 | Forrest | 361/212 |
| 4,160,503 | 7/1979 | Ohlbach | 206/328 |
| 4,211,324 | 7/1980 | Ohlbach | 206/328 |
| 4,223,368 | 9/1980 | Dattilo | 361/220 |
| 4,238,030 | 12/1980 | Maylandt | 206/313 |
| 4,241,829 | 12/1980 | Hardy | 206/328 |
| 4,293,070 | 10/1981 | Ohlbach | 206/328 |

OTHER PUBLICATIONS

IBM Technical Disclosure Bulletin, vol. 17, No. 10, Mar. 1975.
Catalog of Conductive Containers, Inc., entitled "Corstat Containers", Form No. CC, 1980.
Catalog of Conductive Containers, Inc., Form No. CC, 1981.
Static Protection Part 1, Part 2, published by Charleswater Products Inc., Cambridge, Mass., 1980.
Passive Static Protection; Theory & Practice, Berbeco, 1980.

Primary Examiner—Joseph Man-Fu Moy

[57] ABSTRACT

Container having walls in the form of corrugated board in which a carbon layer is applied to the interior surface of one of the webs before the corrugated board is assembled.

4 Claims, 4 Drawing Figures

CONTAINER FOR STATIC-SENSITIVE ARTICLES

BACKGROUND OF THE INVENTION

In the recent past, industry has been faced with the problem presented by the sensitivity of modern electronic circuits to static electricity. This is particularly true of printed circuit boards and the like that use integrated circuits. These circuits can be completely destroyed by being subject to static electricity. As is well known, such static electricity can reach 20,000 volts in the common situation of a human being walking across a carpeted room. It is, therefore, important that containers or packages be provided to retain these static-sensitive articles in such a way that they are insulated against static electricity. For this purpose, a number of techniques have been used, usually involving layers of conductive materials such as foil and the like that are incorporated into the packages to surround the articles, so that the static electricity is drained away. In order to maintain the cost of such containers at a low value, it has become common practice to use carbon layers for this purpose, the carbon layer being printed on the material from which the container is made. Since corrugated board is the material from which most inexpensive containers are made, it has become common practice to coat a surface of the board with the carbon layer. There are a number of difficulties experienced with that process, one of which is that the carbon layer would normally be applied in the factory which makes the corrugated board. The corrugated board is then shipped to a converter who makes it into various types of containers. It can be seen, then, that the handling of the board between the manufacturing plant and the converters plant could result in destruction of this layer of carbon. Also, once the container is made, the carbon layer is exposed to the action of the static-sensitive article during shipment and the like, and particles of the carbon can become dislodged and land in a critical area on an integrated circuit for instance, on an I.C. chip. These and other difficulties experienced with the prior art devices have been obviated in a novel manner by the present invention.

It is, therefore, an outstanding object of the invention to provide a container for static-sensitive articles in which a static barrier is incorporated in a corrugated board wall in such a way that it is not exposed on an exterior surface.

Another object of this invention is the provision of a container having a static barrier in which particles of carbon can not be loosened and come in contact with static-sensitive articles contained therein.

A further object of the present invention is the provision of a corrugated board for a static-shielded container, which board has a carbon layer incorporated in the interior during manufacture, so that handling in transportation from the board manufacturer to the converter can not damage the layer.

It is another object of the instant invention to provide a container for use with static-sensitive articles which is simple in construction, which is inexpensive to manufacture, and which is capable of extensive use without damage or deterioration of the static electricity shielding capability.

With these and other objects in view, as will be apparent to those skilled in the art, the invention resides in the combination of parts set forth in the specification and covered by the claims appended hereto.

SUMMARY OF THE INVENTION

In general, the invention consists of a container for use with an article which can be damaged by static electricity, the container having a plurality of walls forming a cell in which the article resides. Each wall consists of a sheet of corrugated board made up of an outer web located outside of the cell, an inner web located inside the cell, and a corrugated flute sandwiched between the inner and outer webs. A carbon layer is carried on the surface of the inner web that faces away from the cell and is attached to the flute.

More specifically, the carbon layer consists of carbon particles impregnated in a liquifiable binder consisting of low-density polyethylene. The process for forming the corrugated board consists of applying the carbon layer to the upper surface of the inner web while it passes in a horizontal path and then passing the inner web down to a path where it joins with the outer web and the flute. The carbon layer is formed by applying the carbon-binder mix in the form of a liquid and passing the web and liquid over a heated roll.

BRIEF DESCRIPTION OF THE DRAWINGS

The character of the invention, however, may be best understood by reference to one of its structural forms, as illustrated by the accompanying drawings, in which.

DESCRIPTION OF THE PREFERRED EMBODIMENT

Figure 1:
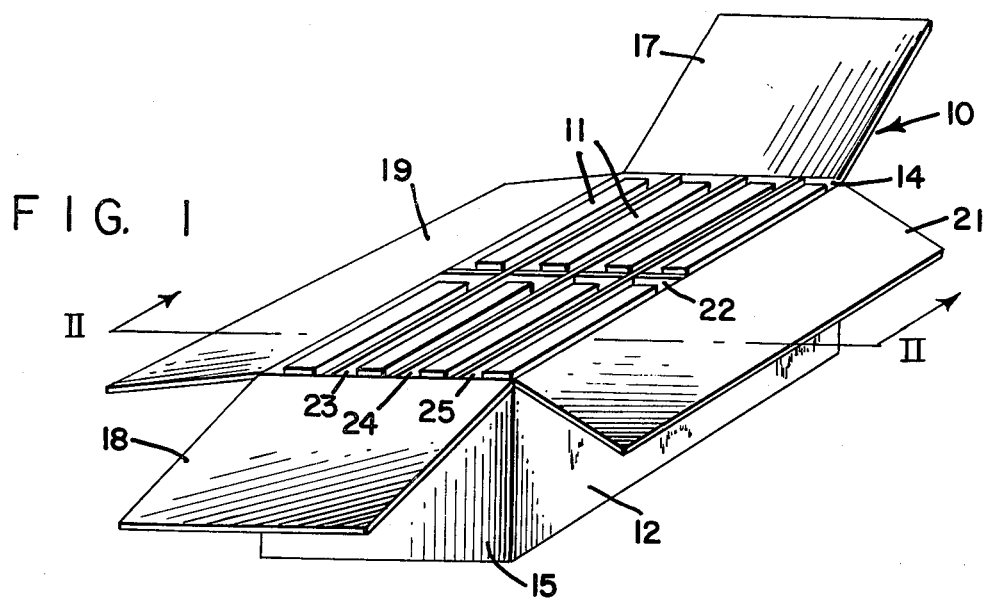
FIG. 1 is a perspective view of a container embodying the principles of the present invention.
Figure 2:
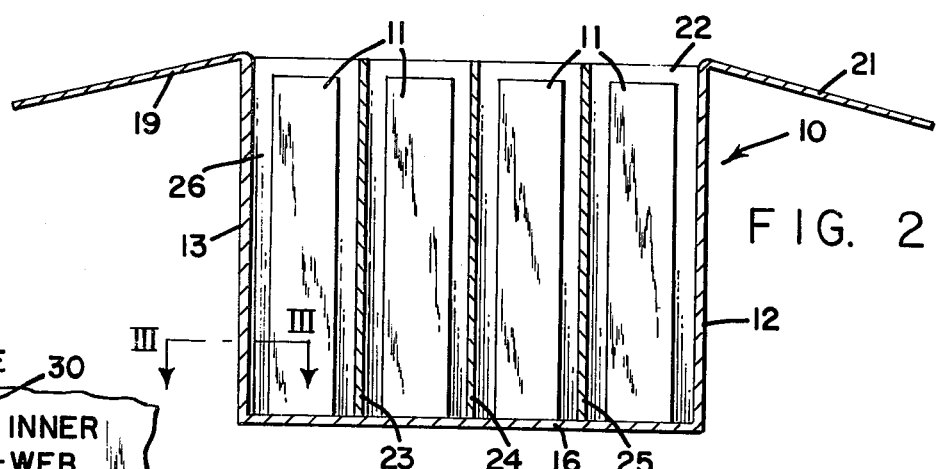
FIG. 2 is a vertical sectional view of the container taken on the line II—II of FIG. 1.

Referring first to FIGS. 1 and 2, which best show the general features of the invention, it can be seen that the container, indicated generally by the reference numeral 10, is intended for use in the transportation of articles 11 which can be damaged by static electricity. These articles can, for instance, be an I.C. chip, such chips being notorious for being easily damaged by receiving a static charge. The container consists of two side walls 12 and 13, two end walls 14 and 15, and a bottom wall 16. The top is closed by the use of end flaps 17 and 18, and side flaps 19 and 21. The container is also provided with a transverse divider wall 22 and longitudinal divider walls 23, 24, and 25, dividing the container up into a number of cells 26. Each cell is defined by a plurality of walls and each wall consists of a sheet of corrugated board.

Figure 3:
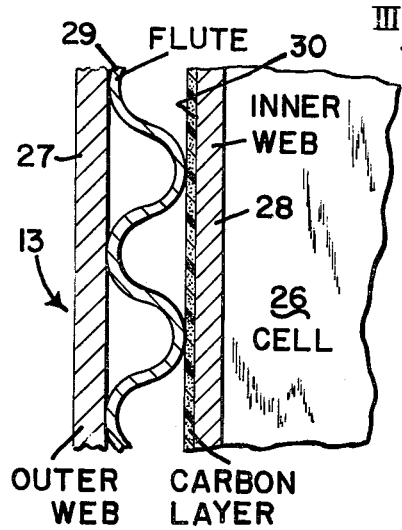
FIG. 3 is an enlarged sectional view of a portion of the container taken on the line III—III of FIG. 2.

Referring next to FIG. 3, which shows the details of a typical wall 13, it can be that the sheet of corrugated board is made up of an outer web 27 located outside of the cell 26, an inner web 28 located inside the cell 26, and a corrugated flute 29 that is sandwiched between the inner and outer webs. A carbon layer 31 is carried on the surface 30 of the inner web 28 that faces away from the cell 26 and which is attached to the flute 29.

In the preferred embodiment, the carbon layer 31 consists of carbon particles that are impregnated in a liquifiable binder. The binder is heat liquifiable and consists of low-density polyethylene.

Figure 4:
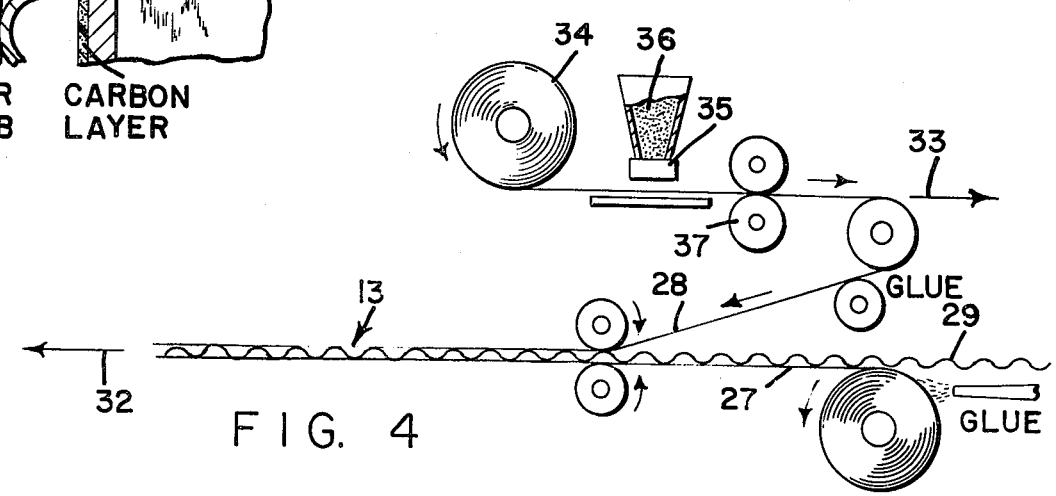
FIG. 4 is a schematic view of apparatus for carrying out a process forming part of the present invention.

FIG. 4 illustrates a process for forming the corrugated board, the wall 13 being typical. The process of FIG. 4 shows the forming of a corrugated board 13. It is intended for use in fabricating a container 10 for a static-sensitive article 11. The first step is the passing of an outer web 27 in a first horizontal path 32. At the same time, a corrugated flute 29 is passed over the outer web in the same direction in the same horizontal path. An inner web 28 is passed from a coil 34 in a second horizontal path 33 that is faced from the horizontal path 32. A sponge 35 applies the carbon-binder mix 36 to the upper surface of the inner web 28 as it passes under it. The inner web with the liquid around it is then passed over a heated roll 37 to dry the mix and form the carbon layer 31. The inner web 28 is then reversed in direction and passed into the first horizontal path 32 on top of the flute 29. The two webs and the flute are joined to form the corrugated board 13. In reversing direction, the carbon layer goes from its upwardly-facing side of the web to the downwardly-facing side and becomes incorporated into the interior of the corrugated board.

The operation and advantages of the present invention will be readily understood in view of the above description. In FIG. 1, it can be seen that the container 10 is provided with a number of cells 26, each of which contains a static-sensitive article, such as a printed circuit or a integrated circuit chip 11. After the article is inserted, the flaps 19 and 21 will be folded over the top side of the container and then sealed by use of the end flaps 17 and 18 to provide each cell with six (6) walls, each one of which has the static electricity barrier or carbon layer 31. Since the corrugated board 13, as manufactured, contains the carbon layer in its interior, any amount of handling during shipment to the converter will not result in wearing or breaking off of the carbon layer or exposure of part of the web to static electricity. In addition, once the converter has received the corrugated board and formed the container 10 from it and the container is used, the carbon will not spall off and come in contact with the sensitive elements of the article 11, because it is not exposed on any of the exterior surfaces of the walls. It is entirely closed within the corrugated board and is not subject to abrasion, breakage, spalling, or the like. In other words, a perfectly reliable barrier against static electricity is provided in the container and there is no opportunity for the conductive layer to be damaged or for particles to loosely fall into the cell 26 containing the article.

It is obvious that minor changes may be made in the form and construction of the invention without departing from the material spirit thereof. It is not, however, desired to confine the invention to the exact form herein shown and described, but it is desired to include all such as properly come within the scope claimed.

The invention having been thus described, what is claimed as new and desired to secure by Letters Patent is:

1. Container for use with an article which can be damaged by static electricity, comprising:
    (a) a plurality of walls forming a cell in which the article resides, each wall consisting of a sheet of corrugated board made up of an outer web located outside the cell, an inner web located inside the cell, and a corrugated flute sandwiched between the inner and outer webs, and
    (b) a carbon layer carried on the surface of the inner web that faces away from the cell and is attached to the flute.

2. Container as recited in claim 1, wherein the carbon layer consists of carbon particles impregnated in a liquifiable binder.

3. Container as recited in claim 2, wherein the binder is heat-liquifiable.

4. Container as recited in claim 3, wherein the binder is a low-density polyethylene.

* * * * *